United States Patent
Xing et al.

(10) Patent No.: US 9,957,162 B2
(45) Date of Patent: May 1, 2018

(54) TERNARY INORGANIC COMPOUND CRYSTAL AND PREPARATION METHOD AND APPLICATION THEREOF

(71) Applicant: SHENZHEN UNIVERSITY, Shenzhen, Guangdong (CN)

(72) Inventors: Feng Xing, Guangdong (CN); Ning Zhang, Guangdong (CN); Zhu Ding, Guangdong (CN); Biao Liu, Guangdong (CN); Ningxu Han, Guangdong (CN); Weilun Wang, Guangdong (CN); Dawang Li, Guangdong (CN); Wujian Long, Guangdong (CN); Biqin Dong, Guangdong (CN); Xiaodong Wang, Guangdong (CN)

(73) Assignee: SHENZHEN UNIVERSITY, Shenzhen (CN)

( * ) Notice: Subject to any disclaimer, the term of this patent is extended or adjusted under 35 U.S.C. 154(b) by 32 days.

(21) Appl. No.: 15/188,964

(22) Filed: Jun. 21, 2016

(65) Prior Publication Data
US 2016/0297680 A1    Oct. 13, 2016

Related U.S. Application Data

(63) Continuation of application No. PCT/CN2013/090570, filed on Dec. 26, 2013.

(51) Int. Cl.
*C01B 25/45* (2006.01)
*C04B 35/624* (2006.01)
(Continued)

(52) U.S. Cl.
CPC ............. *C01B 25/45* (2013.01); *C04B 28/02* (2013.01); *C04B 35/447* (2013.01);
(Continued)

(58) Field of Classification Search
CPC ..... C01B 25/45; C04B 35/447; C04B 35/624; C04B 35/6455; C04B 2235/447;
(Continued)

(56) References Cited

U.S. PATENT DOCUMENTS 3,821,357 A * 6/1974 Cassidy ................ C01B 25/455
423/300
3,966,482 A * 6/1976 Cassidy ................... C04B 7/32
106/690

(Continued)

FOREIGN PATENT DOCUMENTS

CN    1498870 A    5/2004

OTHER PUBLICATIONS

International Search Report of PCT Patent Application No. PCT/CN2013/090570 dated Jul. 7, 2014.

*Primary Examiner* — Ngoc-Yen Nguyen

(57) ABSTRACT

Provided is a ternary inorganic compound crystal having a molecular formula of $Ca_8Al_{12}P_2O_{31}$, and a preparation method thereof comprising the following steps: weighing calcium salts, aluminum salts and phosphate respectively according to the molar ratio of calcium, aluminum and phosphorus in the molecular formula $Ca_8Al_{12}P_2O_{31}$; calcining at 1550~1570° C., cooling, and grinding to obtain the ternary inorganic compound crystal. Also provided is an application of the ternary inorganic compound in gelling materials and molecular sieves, nonlinear optical crystals, and photochromic materials.

5 Claims, 1 Drawing Sheet

(51) Int. Cl.
  *C30B 1/02* (2006.01)
  *C30B 29/14* (2006.01)
  *C30B 29/22* (2006.01)
  *C04B 35/447* (2006.01)
  *C04B 28/02* (2006.01)
  *C04B 35/645* (2006.01)
  *C30B 1/04* (2006.01)
  *C30B 1/10* (2006.01)
  *C04B 103/44* (2006.01)

(52) U.S. Cl.
  CPC ........ *C04B 35/624* (2013.01); *C04B 35/6455* (2013.01); *C30B 1/02* (2013.01); *C30B 1/04* (2013.01); *C30B 1/10* (2013.01); *C30B 29/14* (2013.01); *C30B 29/22* (2013.01); *C04B 2103/445* (2013.01); *C04B 2235/3208* (2013.01); *C04B 2235/3217* (2013.01); *C04B 2235/447* (2013.01); *C04B 2235/6567* (2013.01); *C04B 2235/661* (2013.01)

(58) Field of Classification Search
  CPC ....... C04B 2235/661; C30B 1/04; C30B 1/10; C30B 29/22
  USPC .......................... 423/593.1, 600, 594.16, 306
  See application file for complete search history.

(56) References Cited

U.S. PATENT DOCUMENTS

| | | | |
|---|---|---|---|
| 2008/0182764 A1* | 7/2008 | Xu | C04B 28/06 507/269 |
| 2012/0189983 A1* | 7/2012 | Hermansson | A61K 6/0612 433/173 |
| 2013/0126166 A1* | 5/2013 | Karcher | C04B 28/00 166/292 |

* cited by examiner

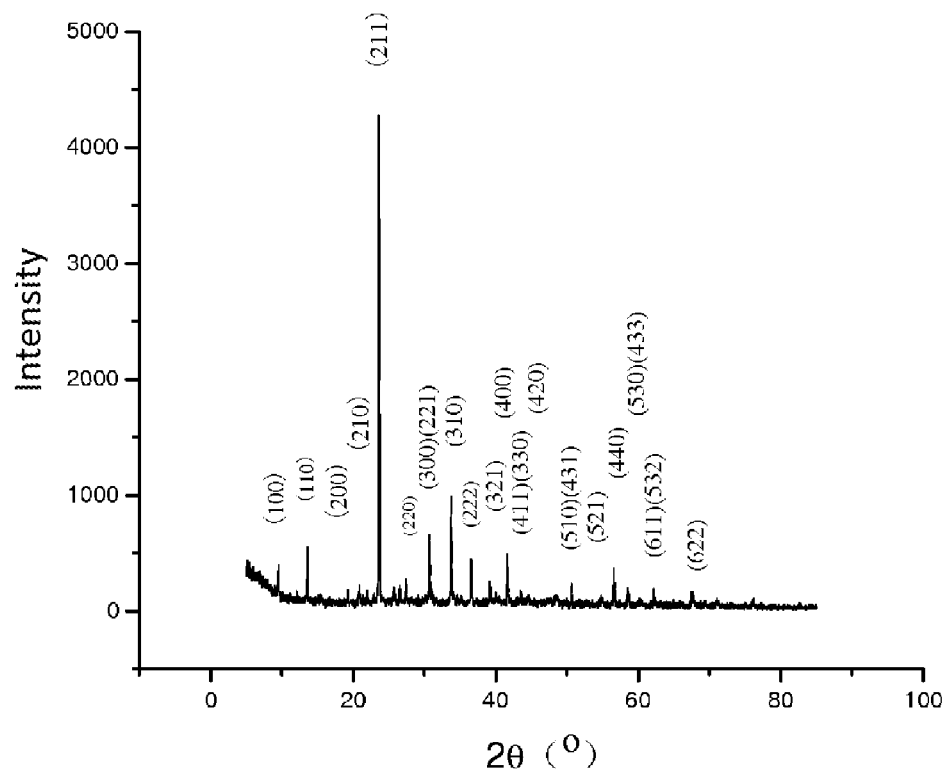

TERNARY INORGANIC COMPOUND CRYSTAL AND PREPARATION METHOD AND APPLICATION THEREOF

CROSS REFERENCE TO RELATED APPLICATIONS

The present application is a Continuation application of PCT application No. PCT/CN2013/090570 filed on Dec. 26, 2013, all the contents of which are hereby incorporated by reference.

TECHNICAL FIELD

The present invention relates to the technical field of new inorganic materials, and specifically to a ternary inorganic compound crystal and a preparation method and use thereof.

BACKGROUND

The binary compound monocalcium aluminate ($CaO \cdot Al_2O_3$, abbreviated as CA) is a clinker in the calcium aluminate cement, which comprises about 40-50% of essential minerals, has a quite high activity, and characterized by normal settling and rapid hardening, thus being a main source of strength of the calcium aluminate cement. The hydration reaction of monocalcium aluminate and the products obtained therefrom vary considerably with temperature. When the temperature is lower than 20° C., the hydration product is $CAH_{10}$; when the temperature is in the range of from 20 to 30° C., the hydration product includes $CAH_{10}$, $C_2AH_8$, and $AH_3$; and when the temperature is higher than 30° C., the hydration product consists of $C_3AH_6$ and $AH_3$. The hydration products $CAH_{10}$, $C_2AH_8$ and other crystalline calcium aluminate hydrates (with a hexagonal platelet morphology) are in a metastable phase, and can spontaneously convert into a finally stable product $C_3AH_6$, accompanying with the formation of a large amount of free water. The conversion is accelerated with increasing temperature. The $C_3AH_6$ crystal has a cubic crystal system, which has a cubic crystalline form, and has a (packed) structural strength far lower than that of $CAH_{10}$ and $C_2AH_8$. Furthermore, the formation of water causes the internal pores to increase, such that the structural strength is decreased. Therefore, the long-term strength of the calcium aluminate cement declines somewhat and generally by a factor of 40 to 50%, which leads to a serious impact in a hot and humid environment, and even causes the structural deterioration. As a result, the calcium aluminate cement generally cannot be used in structural engineering.

As a new bone repair and substitute material, the calcium phosphate cement receives great attention and becomes a focus of research and application in the art of clinical tissue repair, due to its good biocompatibility, osteoconductivity, biosafety, capability of arbitrary shape formation, and low heat release during the hardening process. However, the use of calcium phosphate cement in a variety of areas is limited by the defects such as slow hydration and hardening, and inadequate mechanical performances. The essential mineral tricalcium phosphate ($Ca_3P_2O_8$, $3CaO \cdot P_2O_5$, or TCP) in the calcium phosphate cement has a quite slow hydration rate at normal temperature to 60° C., and the hydration can be accelerated only at a certain temperature, so as to give a high-strength, highly durable hydration product.

SUMMARY

In view of this, the present invention provides a ternary inorganic compound crystal.

The present invention further provides a method for preparing a ternary inorganic compound crystal.

A ternary inorganic compound crystal having a molecular formula of $Ca_8Al_{12}P_2O_{31}$ is provided.

A method for preparing a ternary inorganic compound crystal is provided, which comprises the steps of:

weighing calcium nitrate, aluminium nitrate, and ammonium dihydrogen phosphate respectively according to the molar ratio among calcium, aluminium, and phosphorus in the molecular formula $Ca_8Al_{12}P_2O_{31}$; adding the calcium nitrate, aluminium nitrate, and ammonium dihydrogen phosphate into water to give a mixed solution; and heating the mixed solution to 70° C.-80° C., with continuously stirring, to form a gel from a sol after distillation of water, and presintering the gel at 600° C. to 800° C. to obtain a presintered product; and pressing the presintered product into blanks, then calcinating the blanks at 1550° C.-1570° C. for 1.5-2.5 hrs, and cooling them to room temperature, to obtain the ternary inorganic compound crystal.

A method for preparing a ternary inorganic compound crystal is provided, which comprises the steps of:

weighing calcium carbonate, aluminium hydroxide, and calcium hydrophosphate respectively according to the molar ratio among calcium, aluminium, and phosphorus in the molecular formula $Ca_8Al_{12}P_2O_{31}$, mixing the calcium carbonate, aluminium hydroxide, and calcium hydrophosphate and then pressing them into blanks, calcinating the blanks at 1550° C.-1570° C. for at least 7 hrs, and cooling them to room temperature, to obtain the ternary inorganic compound crystal.

The use of the ternary inorganic compound crystal in gel materials, molecular sieves, nonlinear optical crystals, and photochromic materials is further provided.

Beneficial Effects

The ternary inorganic compound crystal has integrated advantages of calcium aluminate and calcium phosphate, such as good hydration property and stable phase in the hydration product, and has interlacedly grown and interpenetrating structure of calcium aluminate and calcium phosphate. Unlike the hydration product of a binary aluminate compound, the hardened cement slurry of the ternary inorganic compound crystal does not undergo phase transition to render the strength to decrease, and this ternary inorganic compound crystal has excellent mechanical performances such as early strength, high strength, and stably developed long-term strength.

BRIEF DESCRIPTION OF THE DRAWING

The FIGURE is an X-ray diffraction pattern of a ternary inorganic compound crystal according to an embodiment of the present invention.

DETAILED DESCRIPTION OF THE INVENTION

To make the objects, technical solutions, and advantages of the present invention clearer, the present invention is described in further detail with reference to accompanying drawings and examples. It should be understood that the specific examples described herein are provided merely for illustrating, instead of limiting the present invention.

A ternary inorganic compound crystal having a molecular formula of $Ca_8Al_{12}P_2O_{31}$ is provided.

Specifically, the oxide composition of the ternary inorganic compound crystal is $8CaO \cdot 6Al_2O_3 \cdot P_2O_5$, wherein the weight percentages of the oxides are respectively: CaO 37.31%, $Al_2O_3$ 50.88%, and $P_2O_5$ 11.81%.

The ternary inorganic compound crystal is characterized by a powder X-ray diffraction pattern with diffraction peaks at 2θ of about 9.62, 13.62, 19.31, 23.71, 33.80, 36.59, and 41.71. As shown in the FIGURE, in the powder X-ray diffraction pattern, the 2θ values, corresponding indices of crystal face (hkl), and relative intensities ($I/I_0$) of diffraction peaks are:

$2θ_1$=9.62, (100), $I_1$=14%; $2θ_2$=13.62, (110), $I_2$=15.8%;
$2θ_3$=16.70, (111), $I_3$=1.7%; $2θ_4$=19.31, (200), $I_4$=4.6%;
$2θ_5$=21.62, (210), $I_5$=4.3%; $2θ_6$=23.71, (211), $I_6$=100%;
$2θ_7$=27.44, (220), $I_7$=8.2%; $2θ_8$=9.62, (300) or (221), $I_8$=2.4%;
$2θ_9$=30.75, (310), $I_9$=17.5%; $2θ_{10}$=33.79, (222), $I_{10}$=28.6%;
$2θ_{11}$=36.59, (321), $I_{11}$=12.1%; $2θ_{12}$=39.21, (400), $I_{12}$=5.0%;
$2θ_{13}$=40.08, (410) or (323), $I_{13}$=5.5%; $2θ_{14}$=41.71, (411) or (330), $I_{14}$=13.1%;
$2θ_{15}$=43.50, (420), $I_{15}$=4.5%; $2θ_{16}$=50.61, (510) or (431), $I_{16}$=7.6%;
$2θ_{17}$=54.88, (521), $I_{17}$=3.5%; $2θ_{18}$=56.61, (440), $I_{18}$=7.6%;
$2θ_{19}$=58.54, (530) or (433), $I_{19}$=7.3%; $2θ_{20}$=67.56, (622), $I_{20}$=4.5%; and
$2θ_{21}$=71.01, (444), $I_{21}$=3.3%.

The ternary inorganic compound crystal has a structure of simple cubic Bravais crystal lattice of cubic crystal system, wherein the cell parameter a is 0.91853 nm, and the number Z of molecules inside the cell is 1.

A method (sol-gel process) for preparing a ternary inorganic compound crystal is further provided, which comprises the steps of:

weighing calcium nitrate, aluminium nitrate, and ammonium dihydrogen phosphate respectively according to the molar ratio among calcium, aluminium, and phosphorus in the molecular formula $Ca_8Al_{12}P_2O_{31}$; adding the calcium nitrate, aluminium nitrate, and ammonium dihydrogen phosphate to water to give a mixed solution; and heating the mixed solution to 70° C.-80° C. with continuously stirring, to form a gel from a sol after distillation of water, and presintering the gel at 600° C.-800° C., to obtain a presintered product; and pressing the presintered product into blanks, then calcinating the blanks at 1550° C.-1570° C. for 1.5-2.5 hrs, and cooling them to room temperature, to obtain the ternary inorganic compound crystal.

Specifically, the calcium nitrate, aluminium nitrate and ammonium dihydrogen phosphate are formulated into a sol in deionized water, from which a gel is then formed. Then the gel is presintered at 600° C.-800° C. The resultant product is further ground, pressed into blanks, and then calcinated at a high temperature. Preferably, the presintering temperature is 700° C., and the high-temperature calcination temperature is not lower than 1550° C. The cooling may be carried out in the air, and the calcinated product may be further ground.

A method (solid-phase reaction process) for preparing a ternary inorganic compound crystal is further provided, which comprises the steps of:

weighing calcium carbonate, aluminium hydroxide, and calcium hydrophosphate respectively according to the molar ratio among calcium, aluminium, and phosphorus in the molecular formula $Ca_8Al_{12}P_2O_{31}$, mixing the calcium carbonate, aluminium hydroxide, and calcium hydrophosphate and then pressing them into blanks, calcinating the blanks at 1550° C.-1570° C. for at least 7 hrs, and cooling them to room temperature, to obtain the ternary inorganic compound crystal.

Specifically, the calcium carbonate, aluminium hydroxide and calcium hydrophosphate are uniformly mixed, ground, and pressed into blanks, which are then calcinated directly at a high temperature. The high-temperature calcination temperature is not lower than 1550° C. The calcination time is not less than 7 hrs because the solid-phase reaction progresses slowly. Preferably, the calcination period is from 7 to 9 hrs. The cooling may be carried out in the air, and the calcinated product may be further ground. The cooling may be carried out in the air, and the calcinated product may be further ground.

For the methods for preparing the present ternary inorganic compound crystal, only the sol-gel process and the solid-phase reaction process are described, with the sol-gel process being preferred. Other methods may also be employed.

Use of the ternary inorganic compound crystal in gel materials, molecular sieves, nonlinear optical crystals, and photochromic materials is further provided.

Hereinafter, the method for preparing the ternary inorganic compound crystal and properties thereof are described by way of examples.

Example 1

Calcium nitrate, aluminium nitrate, and ammonium dihydrogen phosphate were weighed respectively according to the molar ratio among calcium, aluminium, and phosphorus in the molecular formula $Ca_8Al_{12}P_2O_{31}$, and added with deionized water to give a mixed solution. The mixed solution was heated on a magnetic stirrer to 70-80° C., and continuously stirred to form a gel from a sol after distillation of water. Then, the gel was presintered at 700° C., ground, pressed into blanks, then calcinated for 2 hrs in a muffle furnace at 1550° C., and cooled in the air to room temperature. The calcinated material was ground into fine powder (wherein the residue on a square mesh screen of 75 μm was 4%), and mixed with water at a water/cement ratio of 0.32, to prepare a standard paste sample (20 mm×20 mm×20 mm) The compressive strength over 12 hrs of the standard paste sample is 37 MPa, and the compressive strength over 1 day is 70 MPa.

Example 2

Calcium nitrate, aluminium nitrate, and ammonium dihydrogen phosphate were weighed respectively according to the molar ratio among calcium, aluminium, and phosphorus in the molecular formula $Ca_8Al_{12}P_2O_{31}$, and added with deionized water to give a mixed solution. The mixed solution was heated on a magnetic stirrer to 70-80° C., and continuously stirred to form a gel from a sol after distillation of water. Then, the gel was presintered at 700° C., ground, pressed into blanks, then calcinated for 2 hrs in a muffle furnace at 1560° C., and cooled in the air to room temperature. The calcinated material was ground into fine powder (wherein the residue on a square mesh screen of 75 μm was 4%), and mixed with water at a water/cement ratio of 0.32, to prepare a standard paste sample (20 mm×20 mm×20 mm) The compressive strength over 12 hrs of the standard paste sample is 38 MPa, and the compressive strength over 1 day is 72 MPa.

Example 3

Calcium nitrate, aluminium nitrate, and ammonium dihydrogen phosphate were weighed respectively according to the molar ratio among calcium, aluminium, and phosphorus in the molecular formula $Ca_8Al_{12}P_2O_{31}$, and added with deionized water to give a mixed solution. The mixed solution was heated on a magnetic stirrer to 70-80° C., and continuously stirred, to form a gel from a sol after distillation of water. Then, the gel was presintered at 700° C., ground, pressed into blanks, then calcinated for 2 hrs in a muffle furnace at 1560° C., and cooled in the air to room temperature. The calcinated material was ground into fine powder (wherein the residue on a square mesh screen of 75 μm was 4%), and mixed with water at a water/cement ratio of 0.32, to prepare a standard paste sample (20 mm×20 mm×20 mm) The compressive strength over 12 hrs of the standard paste sample is 38 MPa, and the compressive strength over 1 day is 73 MPa.

Example 4

Calcium carbonate, aluminium hydroxide, and calcium hydrophosphate were weighed respectively according to the molar ratio among calcium, aluminium, and phosphorus in the molecular formula $Ca_8Al_{12}P_2O_{31}$, uniformly mixed, pressed into blanks, calcinated for 8 hrs in a muffle furnace at 1550° C., and then cooled in the air to room temperature. The calcinated material was ground into fine powder (wherein the residue on a square mesh screen of 75 μm was 4%), and mixed with water at a water/cement ratio of 0.32, to prepare a standard paste sample (20 mm×20 mm×20 mm) The compressive strength over 12 hrs of the standard paste sample is 31 MPa, and the compressive strength over 1 day is 65 MPa.

Example 5

Calcium carbonate, aluminium hydroxide, and calcium hydrophosphate were weighed respectively according to the molar ratio among calcium, aluminium, and phosphorus in the molecular formula $Ca_8Al_{12}P_2O_{31}$, uniformly mixed, pressed into blanks, calcinated for 8 hrs in a muffle furnace at 1560° C., and then cooled in the air to room temperature. The calcinated material was ground into fine powder (wherein the residue on a square mesh screen of 75 μm was 4%), and mixed with water at a water/cement ratio of 0.32, to prepare a standard paste sample (20 mm×20 mm×20 mm) The compressive strength over 12 hrs of the standard paste sample is 33 MPa, and the compressive strength over 1 day is 66 MPa.

Example 6

Calcium carbonate, aluminium hydroxide, and calcium hydrophosphate were weighed respectively according to the molar ratio among calcium, aluminium, and phosphorus in the molecular formula $Ca_8Al_{12}P_2O_{31}$, uniformly mixed, pressed into blanks, calcinated for 8 hrs in a muffle furnace at 1570° C., and then cooled in the air to room temperature. The calcinated material was ground into fine powder (wherein the residue on a square mesh screen of 75 μm was 4%), and mixed with water at a water/cement ratio of 0.32, to prepare a standard paste sample (20 mm×20 mm×20 mm) The compressive strength over 12 hrs of the standard paste sample is 36 MPa, and the compressive strength over 1 day is 68 MPa.

Example 7

Calcium nitrate, aluminium nitrate, and ammonium dihydrogen phosphate were weighed respectively according to the molar ratio among calcium, aluminium, and phosphorus in the molecular formula $Ca_8Al_{12}P_2O_{31}$, and added with deionized water to give a mixed solution. The mixed solution was heated on a magnetic stirrer to 70-80° C., and continuously stirred, to form a gel from a sol after distillation of water. Then, the gel was presintered at 700° C., ground, pressed into blanks, then calcinated for 2 hrs in a muffle furnace at 1550° C., and cooled in the air to room temperature, to prepare a polycrystal sample of 5-50 μm, which is used as a molecular sieve.

Example 8

Calcium nitrate, aluminium nitrate, and ammonium dihydrogen phosphate were weighed respectively according to the molar ratio among calcium, aluminium, and phosphorus in the molecular formula $Ca_8Al_{12}P_2O_{31}$, and added with deionized water to give a mixed solution. The mixed solution was heated on a magnetic stirrer to 70-80° C., and continuously stirred, to form a gel from a sol after distillation of water. Then, the gel was presintered at 700° C., ground, pressed into blanks, then calcinated for 2 hrs in a muffle furnace at 1550° C., cooled in the air to room temperature, and grown into a large-size monocrystal by a molten salt method (flux method), which is used for preparing a non-linear optical material.

The foregoing description is merely preferred embodiments of the present invention, and the present invention is not limited thereto. Any modifications, equivalent replacements, and improvements made without departing from the spirit and principle of the present invention fall within the protection scope of the present invention.

What is claimed is:

1. A ternary inorganic compound crystal having a molecular formula of $Ca_8Al_{12}P_2O_{31}$, wherein oxide of the $Ca_8Al_{12}P_2O_{31}$ has a composition of $8CaO.6Al_2O_3P_2O_5$ and the $Ca_8Al_{12}P_2O_{31}$ is characterized by a powder X-ray diffraction pattern with diffraction peaks at 2θ of 9.62, 13.62, 19.31, 23.71, 33.80, 36.59, and 41.71.

2. A method for preparing a ternary inorganic compound crystal, comprising the steps of:
    weighing calcium nitrate, aluminium nitrate, and ammonium dihydrogen phosphate respectively according to the molar ratio among calcium, aluminium, and phosphorus in the molecular formula $Ca_8Al_{12}P_2O_{31}$; adding the calcium nitrate, aluminium nitrate, and ammonium dihydrogen phosphate to a water to give a mixed solution; and heating the mixed solution to 70° C.-80° C. with continuously stirring, the mixed solution form a sol and further form a gel after distillation of water, and presintering the gel at 600° C.-800° C., to obtain a presintered product; and
    pressing the presintered product into blanks, then calcinating the blanks at 1550° C.-1570° C. for 1.5-2.5 hrs, and cooling them to room temperature, to obtain the ternary inorganic compound crystal.

3. The method according to claim 2, wherein the presintering temperature is 700° C.

4. A method for preparing a ternary inorganic compound crystal, comprising the steps of:
    weighing calcium carbonate, aluminium hydroxide, and calcium hydrophosphate respectively according to the molar ratio among calcium, aluminium, and phosphorus in the molecular formula $Ca_8Al_{12}P_2O_{31}$, mixing the calcium carbonate, aluminium hydroxide, and calcium hydrophosphate and then pressing them into blanks, calcinating the blanks at 1550° C.-1570° C. for at least 7 hrs, and cooling them to room temperature, to obtain the ternary inorganic compound crystal.

5. The method according to claim 4, wherein the blanks are calcinated for 7 to 9 hrs.

\* \* \* \* \*